United States Patent
Fujiura et al.

(10) Patent No.: US 12,085,628 B2
(45) Date of Patent: Sep. 10, 2024

(54) SIGNAL PROCESSING METHOD, PROGRAM, AND SIGNAL PROCESSING SYSTEM

(71) Applicant: Panasonic Intellectual Property Management Co., Ltd., Osaka (JP)

(72) Inventors: Hideaki Fujiura, Osaka (JP); Yoshiyuki Saito, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 132 days.

(21) Appl. No.: 17/774,791

(22) PCT Filed: Nov. 5, 2020

(86) PCT No.: PCT/JP2020/041421
§ 371 (c)(1),
(2) Date: May 5, 2022

(87) PCT Pub. No.: WO2021/095641
PCT Pub. Date: May 20, 2021

(65) Prior Publication Data
US 2022/0404442 A1     Dec. 22, 2022

(30) Foreign Application Priority Data

Nov. 11, 2019   (JP) ................. 2019-204208

(51) Int. Cl.
*G01R 33/09*     (2006.01)
(52) U.S. Cl.
CPC .................. *G01R 33/09* (2013.01)
(58) Field of Classification Search
CPC ........................... G01R 33/09–098
See application file for complete search history.

(56) References Cited

U.S. PATENT DOCUMENTS

2004/0112148 A1    6/2004  Sakai
2011/0087456 A1*   4/2011  Satou ............... B62D 5/049
                                          324/207.25
(Continued)

FOREIGN PATENT DOCUMENTS

JP    2000-039335 A    2/2000
JP    2003-050125 A    2/2003
(Continued)

OTHER PUBLICATIONS

International Search Report issued in corresponding International Patent Application No. PCT/JP2020/041421, dated Dec. 1, 28, 2020, with English translation.
(Continued)

*Primary Examiner* — Paresh Patel
(74) *Attorney, Agent, or Firm* — Rimon P.C.

(57) ABSTRACT

A signal processing method according to the present disclosure is for use in a signal processing system including a first magnetic detection unit, a second magnetic detection unit, and a processing unit. The signal processing method includes an angle calculating step and a failure diagnosis step. The angle calculating step includes transforming, by using an inverse trigonometric function, a sine signal, a cosine signal, and a tangent signal into a first angle signal, a second angle signal, and a third angle signal, respectively. The failure diagnosis step includes making a failure diagnosis of the first magnetic detection unit and the second magnetic detection unit by comparing with each other two or more pieces of angle information selected from first angle information, second angle information, and third angle information.

14 Claims, 5 Drawing Sheets

(56) References Cited

U.S. PATENT DOCUMENTS

| | | | |
|---|---|---|---|
| 2015/0061653 A1* | 3/2015 | Nakamura | G01R 33/09 324/207.21 |
| 2019/0316935 A1 | 10/2019 | Jost et al. | |
| 2020/0300601 A1 | 9/2020 | Mori et al. | |

FOREIGN PATENT DOCUMENTS

| | | |
|---|---|---|
| JP | 2004-177273 A | 6/2004 |
| JP | 2004-239672 A | 8/2004 |
| JP | 2004-264167 A | 9/2004 |
| JP | 2005-114442 A | 4/2005 |
| JP | 2009-300396 A | 12/2009 |
| JP | 2017-067695 A | 4/2017 |
| JP | 2017-198515 A | 11/2017 |
| WO | 2017/187601 A1 | 11/2017 |
| WO | 2019/054089 A1 | 3/2019 |

OTHER PUBLICATIONS

Notice of Reasons for Refusal dated Jun. 25, 2024 issued in the related Japanese Patent Application No. 2021-556062, with English machine translation.

* cited by examiner

SIGNAL PROCESSING METHOD, PROGRAM, AND SIGNAL PROCESSING SYSTEM

CROSS-REFERENCE OF RELATED APPLICATIONS

This application is the U.S. National Phase under 35 U.S.C. § 371 of International Patent Application No. PCT/JP2020/041421, filed on Nov. 5, 2020, which in turn claims the benefit of Japanese Application No. 2019-204208, filed on Nov. 11, 2019, the entire disclosures of which Applications are incorporated by reference herein.

TECHNICAL FIELD

The present disclosure generally relates to a signal processing method, a program, and a signal processing system. More particularly, the present disclosure relates to a signal processing method for use in a signal processing system, a program, and the signal processing system.

BACKGROUND ART

Patent Literature 1 discloses a signal processing system (magnetic sensor) for use to detect the steering angle of an automobile, for example. The signal processing system of Patent Literature 1 includes a first magnetoresistance element, a second magnetoresistance element, and a detection circuit which receives a signal from the first magnetoresistance element and a signal from the second magnetoresistance element. Each of the first magnetoresistance element and the second magnetoresistance element includes four sine magnetoresistance elements and four cosine magnetoresistance elements.

In the signal processing system of Patent Literature 1, the detection circuit generates an angle signal, including information about the angle of rotation, based on a detection signal supplied from the first magnetoresistance element and a detection signal supplied from the second magnetoresistance element.

On the other hand, such a signal processing system is a combination of two signal processing systems having the same configuration. This allows the signal processing system to make a failure diagnosis of itself by comparing the detection results obtained by the two signal processing systems with each other.

CITATION LIST

Patent Literature

Patent Literature 1: JP 2017-198515 A

SUMMARY OF INVENTION

However, the signal processing system of Patent Literature 1 requires the two signal processing systems, thus causing a significant increase in the overall size of the signal processing system, which is a problem with the signal processing system of Patent Literature 1.

An object of the present disclosure is to provide a signal processing method, a program, and a signal processing system, all of which are configured or designed to enable making a failure diagnosis of first and second magnetic detection units while reducing an increase in the overall size of the signal processing system.

A signal processing method according to an aspect of the present disclosure is designed for use in a signal processing system including a first magnetic detection unit, a second magnetic detection unit, and a processing unit. The first magnetic detection unit outputs a sine signal corresponding to an angle of rotation of a detected magnetic field. The second magnetic detection unit outputs a cosine signal corresponding to the angle of rotation of the detected magnetic field and having a phase difference of $\pi/2$ from the sine signal. The processing unit outputs, based on at least one of the sine signal or the cosine signal, an angle signal and a failure signal. The angle signal includes angle information about the angle of rotation of the detected magnetic field. The failure signal includes failure information about a failure of at least one of the first magnetic detection unit or the second magnetic detection unit. The signal processing method includes an angle calculating step and a failure diagnosis step. The angle calculating step includes transforming, by using an inverse trigonometric function, the sine signal, the cosine signal, and a tangent signal into a first angle signal serving as the angle signal, a second angle signal, and a third angle signal, respectively. The tangent signal is a signal based on the sine signal and the cosine signal. The failure diagnosis step includes making a failure diagnosis of the first magnetic detection unit and the second magnetic detection unit by comparing with each other two or more pieces of angle information selected from the group consisting of first angle information, second angle information, and third angle information. The first angle information is angle information included in the first angle signal. The second angle information is angle information included in the second angle signal. The third angle information is angle information included in the third angle signal.

A program according to another aspect of the present disclosure is designed to cause one or more processors to perform the signal processing method described above.

A signal processing system according to still another aspect of the present disclosure includes a first magnetic detection unit, a second magnetic detection unit, and a processing unit. The first magnetic detection unit outputs a sine signal corresponding to an angle of rotation of a detected magnetic field. The second magnetic detection unit outputs a cosine signal corresponding to the angle of rotation of the detected magnetic field and having a phase difference of $\pi/2$ from the sine signal. The processing unit outputs, based on at least one of the sine signal or the cosine signal, an angle signal and a failure signal. The angle signal includes angle information about the angle of rotation of the detected magnetic field. The failure signal includes failure information about a failure of at least one of the first magnetic detection unit or the second magnetic detection unit. The processing unit includes an angle calculation unit and a failure diagnosis unit. The angle calculation unit transforms, by using an inverse trigonometric function, the sine signal, the cosine signal, and a tangent signal into a first angle signal serving as the angle signal, a second angle signal, and a third angle signal, respectively. The tangent signal is a signal based on the sine signal and the cosine signal. The failure diagnosis unit makes a failure diagnosis of the first magnetic detection unit and the second magnetic detection unit by comparing with each other two or more pieces of angle information selected from the group consisting of first angle information, second angle information, and third angle information. The first angle information is angle information included in the first angle signal. The second angle information is angle information included in the second angle signal. The third angle information is angle information included in the third angle signal.

DESCRIPTION OF EMBODIMENTS

Embodiments (1) Overview

First, an overview of a signal processing method and signal processing system 100 according to an exemplary embodiment will be described with reference to FIGS. 1 and 2.

A signal processing method according to an exemplary embodiment is designed for use in a signal processing system 100. The signal processing system 100 may be a magnetic sensor, for example. The signal processing system 100 may be used, for example, to detect the angle of rotation of a rotator such as the steering shaft of au automobile. Specifically, in the signal processing system 100, the resistance values of first magnetoresistors 111-114 and second magnetoresistors 211-214 (to be described later) vary in response to a variation in the magnetic field from a magnet coupled to the rotator via gears, for example. Then, the signal processing system 100 may detect the angle of rotation of the rotator by detecting the variation in the resistance values of the first magnetoresistors 111-114 and the second magnetoresistors 211-214.

Figure 1:
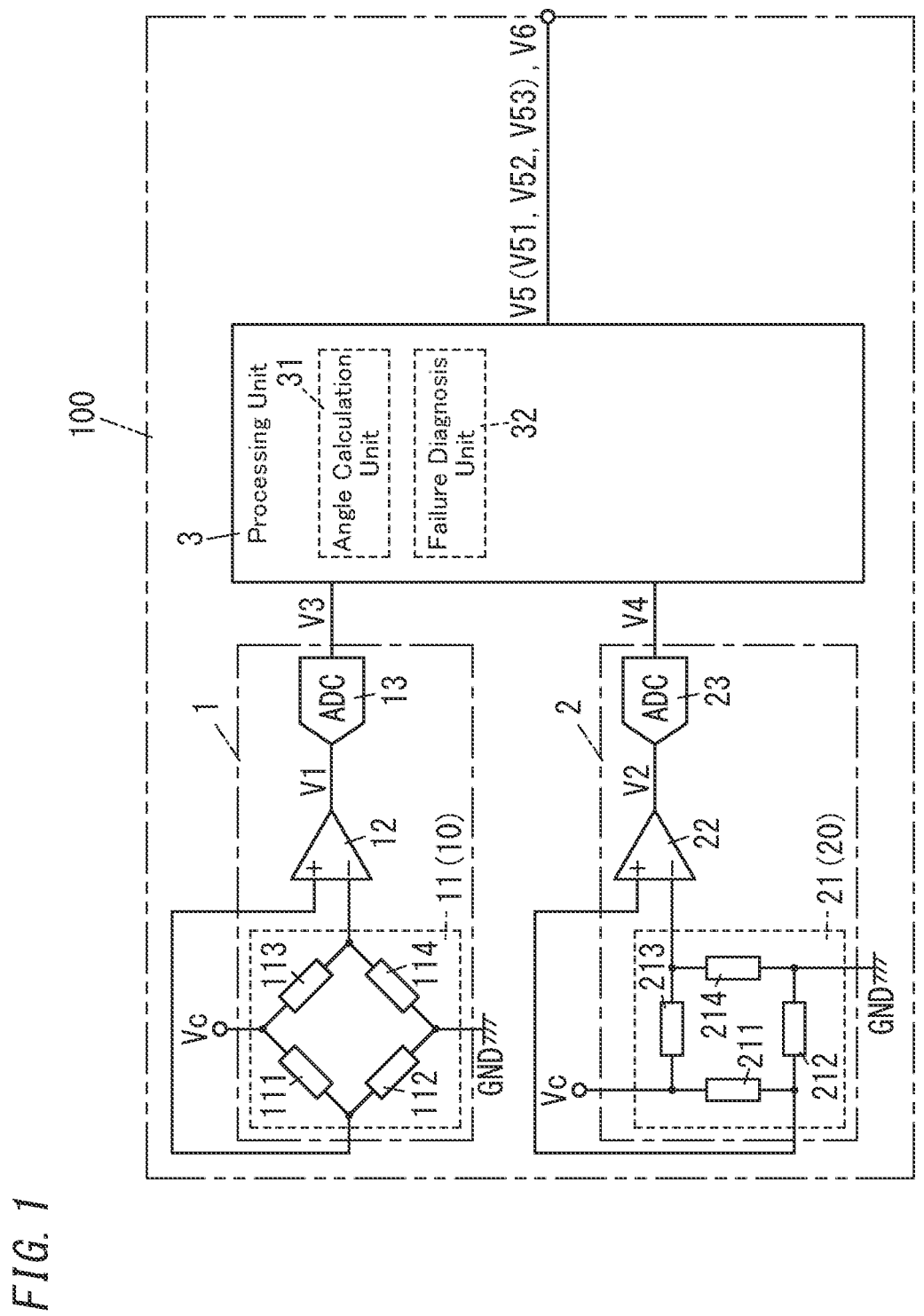
FIG. 1 is a block diagram illustrating a configuration for a signal processing system according to an exemplary embodiment.

The signal processing system 100 according to this exemplary embodiment includes a first magnetic detection unit 1, a second magnetic detection unit 2, and a processing unit 3 as shown in FIG. 1. The first magnetic detection unit 1 outputs a sine signal S1 (see FIG. 2) corresponding to the angle of rotation of a detected magnetic field. The second magnetic detection unit 2 outputs a cosine signal S2 (see FIG. 2) corresponding to the angle of rotation of the detected magnetic field. The cosine signal S2 is a signal having a phase difference of π/2 from the sine signal S1. As used herein, the "detected magnetic field" refers to the magnetic field from the magnet to be detected based on the resistance values of the first magnetoresistors 111-114 and the second magnetoresistors 211-214. Thus, the angle of rotation of the rotator may be detected indirectly by detecting the angle of rotation of the detected magnetic field. The processing unit 3 outputs, based on at least one of the sine signal S1 or the cosine signal S2, an angle signal V5 and a failure signal V6. The angle signal V5 includes angle information about the angle of rotation of the detected magnetic field. The failure signal V6 includes failure information about a failure of at least one of the first magnetic detection unit 1 or the second magnetic detection unit 2. The angle information may be the angle of rotation of the detected magnetic field. However, the angle information does not have to be the angle of rotation but may also be any other type of information as long as the information concerns the angle of rotation. The failure information may be information about a failure itself but may also be any other type of information as long as the failure information may indicate that a failure has been caused.

A signal processing method includes an angle calculating step and a failure diagnosis step. The angle calculating step includes transforming, by using an inverse trigonometric function, the sine signal S1, the cosine signal S2, and a tangent signal into a first angle signal V51, a second angle signal V52, and a third angle signal V53, respectively. The tangent signal is a signal based on the sine signal S1 and the cosine signal S2. Specifically, the value of the tangent signal is calculated by dividing the value of the sine signal S1 by the value of the cosine signal S2. The failure diagnosis step includes making a failure diagnosis of the first magnetic detection unit 1 and the second magnetic detection unit 2 by comparing with each other two or more pieces of angle information selected from the group consisting of first angle information, second angle information, and third angle information. The first angle information is angle information included in the first angle signal V51 and corresponding to the sine signal S1. The second angle information is angle information included in the second angle signal V52 and corresponding to the cosine signal S2. The third angle information is angle information included in the third angle signal V53 and corresponding to the tangent signal.

The processing unit 3 includes an angle calculation unit 31 and a failure diagnosis unit 32 as shown in FIG. 1. The angle calculation unit 31 transforms, by using an inverse trigonometric function, the sine signal S1, the cosine signal S2, and the tangent signal into the first angle signal V51, the second angle signal V52, and the third angle signal V53, respectively. The tangent signal is a signal based on the sine signal S1 and the cosine signal S2. Specifically, the value of the tangent signal is calculated by dividing the value of the sine signal S1 by the value of the cosine signal S2. The failure diagnosis unit 32 makes a failure diagnosis of the first magnetic detection unit 1 and the second magnetic detection unit 2 by comparing with each other two or more pieces of angle information selected from the group consisting of the first angle information, the second angle information, and the third angle information. The first angle information is angle information included in the first angle signal V51 and corresponding to the sine signal S1. The second angle information is angle information included in the second angle signal V52 and corresponding to the cosine signal S2. The third angle information is angle information included in the third angle signal V53 and corresponding to the tangent signal.

(2) Configuration

Next, a configuration for the signal processing system (magnetic sensor) 100 according to an exemplary embodiment will be described with reference to FIGS. 1 and 2.

The signal processing system 100 according to this exemplary embodiment includes the first magnetic detection unit 1, the second magnetic detection unit 2, and the processing unit 3 as shown in FIG. 1.

(2.1) First Magnetic Detection Unit

The first magnetic detection unit 1 includes a first magnetoresistance element 11, a first amplifier 12, and a first A/D converter 13. The first magnetoresistance element 11 may be, for example, an anisotropic magnetoresistance (AMR) element.

The first magnetoresistance element 11 includes a first bridge circuit 10. The first bridge circuit 10 may be implemented as, for example, a full bridge circuit made up of a plurality of (e.g., four in the example illustrated in FIG. 1) first magnetoresistors 111-114, for example. Specifically, a first series circuit is formed by connecting respective first ends of the first magnetoresistors 111, 112 and a second series circuit is formed by connecting respective first ends of the first magnetoresistors 113, 114. Then, the first series circuit and the second series circuit are electrically connected between a reference potential Vc and the ground GND. In other words, the respective second ends of the first magnetoresistors 111, 113 are electrically connected to the reference potential Vc and the respective second ends of the first magnetoresistors 112, 114 are electrically connected to the ground GND.

In this case, each of the first magnetoresistors 111-114 has a resistance value, which varies as the magnetic field from a magnet coupled to the rotator via a gear, for example, varies. In addition, in this first bridge circuit 10, two sine signals (sinusoidal wave signals), of which the phases are different from each other by $\pi$ (180 degrees), are respectively output from a node of connection between the first magnetoresistors 111, 112 and a node of connection between the first magnetoresistors 113, 114. Specifically, in this first bridge circuit 10, a +sin signal is output from the node of connection between the first magnetoresistors 111, 112 and a −sin signal is output from the node of connection between the first magnetoresistors 113, 114.

The first amplifier 12 may be implemented as, for example, a differential amplifier. The first amplifier 12 includes a first input terminal, a second input terminal, and an output terminal. The first input terminal is a non-inverting input terminal and is electrically connected to the node of connection between the first magnetoresistors 111, 112 of the first bridge circuit 10. The second input terminal is an inverting input terminal and is electrically connected to the node of connection between the first magnetoresistors 113, 114 of the first bridge circuit 10. The first amplifier 12 makes differential amplification on the +sin signal provided to its first input terminal and the −sin signal provided to its second input terminal, thereby generating a sin signal V1, of which the amplitude has been doubled. The first amplifier 12 outputs the sin signal V1 thus generated through its output terminal.

The first A/D converter 13 performs analog-to-digital conversion on the analog signal (sin signal) V1 supplied from the first amplifier 12 at a predetermined sample frequency and outputs the signal thus converted as a digital signal V3. That is to say, in this embodiment, the digital signal V3 supplied from the first A/D converter 13 is the sine signal S1.

(2.2) Second Magnetic Detection Unit

The second magnetic detection unit 2 includes a second magnetoresistance element 21, a second amplifier 22, and a second A/D converter 23. The second magnetoresistance element 21 may be, for example, an anisotropic magnetoresistance (AMR) element.

The second magnetoresistance element 21 includes a second bridge circuit 20. The second bridge circuit 20 may be implemented as, for example, a full bridge circuit made up of a plurality of (e.g., four in the example illustrated in FIG. 1) second magnetoresistors 211-214, for example. Specifically, a first series circuit is formed by connecting respective first ends of the second magnetoresistors 211, 212 and a second series circuit is formed by connecting respective first ends of the second magnetoresistors 213, 214. Then, the first series circuit and the second series circuit are electrically connected between the reference potential Vc and the ground GND. In other words, the respective second ends of the second magnetoresistors 211, 213 are electrically connected to the reference potential Vc and the respective second ends of the second magnetoresistors 212, 214 are electrically connected to the ground GND.

The second bridge circuit 20 is arranged to define an angle of rotation of 45 degrees with respect to the first bridge circuit 10. Thus, in this second bridge circuit 20, two cosine signals (cosine wave signals), of which the phases are different from each other by $\pi$ (180 degrees), are respectively output from a node of connection between the second magnetoresistors 211, 212 and a node of connection between the second magnetoresistors 213, 214. Specifically, in this second bridge circuit 20, a +cos signal is output from the node of connection between the second magnetoresistors 211, 212 and a −cos signal is output from the node of connection between the second magnetoresistors 213, 214.

The second amplifier 22 may be implemented as, for example, a differential amplifier. The second amplifier 22 includes a first input terminal, a second input terminal, and an output terminal. The first input terminal is a non-inverting input terminal and is electrically connected to the node of connection between the second magnetoresistors 211, 212 of the second bridge circuit 20. The second input terminal is an inverting input terminal and is electrically connected to the node of connection between the second magnetoresistors 213, 214 of the second bridge circuit 20. The second amplifier 22 makes differential amplification on the +cos signal provided to its first input terminal and the −cos signal provided to its second input terminal, thereby generating a cos signal V2, of which the amplitude has been doubled. The second amplifier 22 outputs the cos signal V2 thus generated through its output terminal.

The second A/D converter 23 performs analog-to-digital conversion on the analog signal (cos signal) V2 supplied from the second amplifier 22 at a predetermined sample frequency and outputs the signal thus converted as a digital signal V4. That is to say, in this embodiment, the digital signal V4 supplied from the second A/D converter 23 is the cosine signal S2.

(2.3) Processing Unit

The processing unit 3 includes the angle calculation unit 31 and the failure diagnosis unit 32 as shown in FIG. 1.

Figure 2:
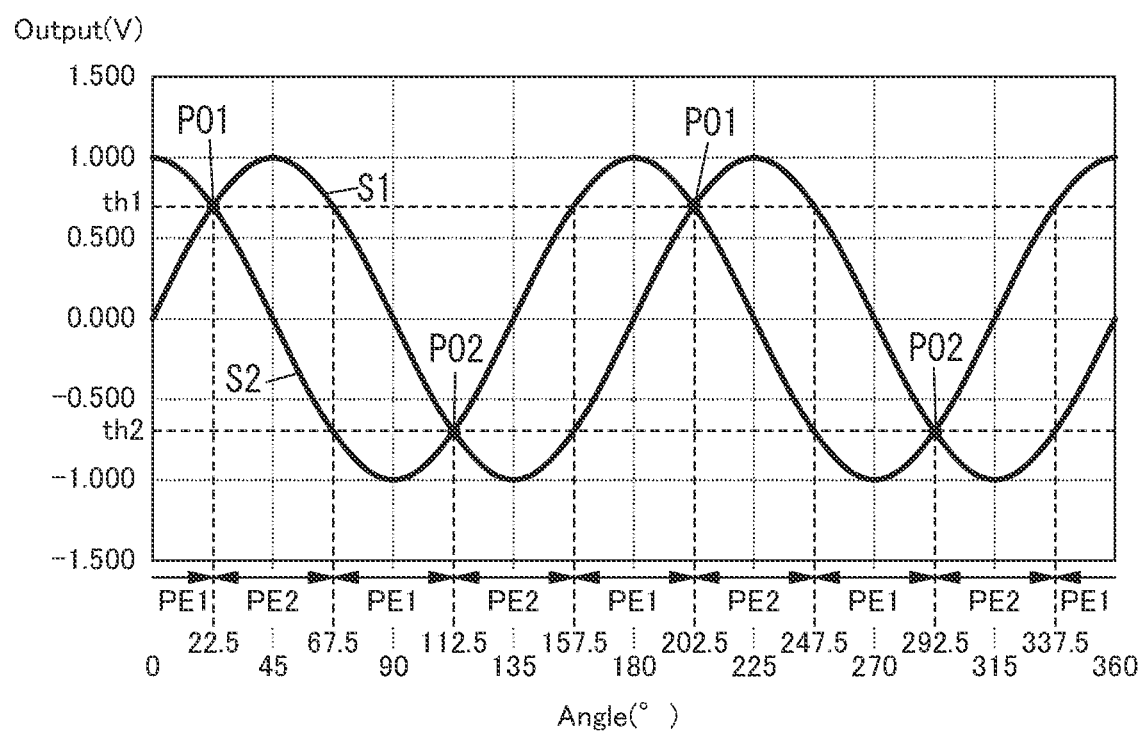
FIG. 2 is a graph showing a relationship between the detected angle and output voltage in the signal processing system.

The angle calculation unit 31 has a first threshold value th1 and a second threshold value th2 (see FIG. 2). The first threshold value th1 and the second threshold value th2 are values at the intersections PO1, PO2 between the sine signal S1 and the cosine signal S2 as shown in FIG. 2. Each of the first threshold value th1 and the second threshold value th2 may be, for example, a voltage value. The second threshold value th2 is smaller than the first threshold value th1. In this embodiment, the first threshold value th1 is a positive value and the second threshold value th2 is a negative value. Also, in this embodiment, the absolute value of the first threshold value th1 and the absolute value of the second threshold value th2 are the same. Alternatively, the absolute value of the first threshold value th1 and the absolute value of the second threshold value th2 may be different from each other.

If the maximum amplitude of the sine signal S1 and the cosine signal S2 is A1, the value of the first threshold value th1 is B1, and the value of the second threshold value th2 is B2, then B1 and B2 are calculated by the following Equations (1) and (2), respectively:

$$B1 = \frac{A1}{2 \times \sin 45°} \quad (1)$$

$$B2 = -\frac{A1}{2 \times \sin 45°} \quad (2)$$

For example, if A1=1 as shown in FIG. 2, then B1≈0.71 and B2≈−0.71.

The angle calculation unit 31 calculates a tangent signal based on the sine signal S1 (digital signal V3) supplied from the first magnetic detection unit 1 and the cosine signal S2 (digital signal V4) supplied from the second magnetic detection unit 2. Specifically, the angle calculation unit 31 calculates the value of the tangent signal by dividing the value of the sine signal S1 by the value of the cosine signal S2. In addition, the angle calculation unit 31 also calculates a first angle signal V51, a second angle signal V52, and a third angle signal V53 (see FIG. 1) based on the sine signal S1, the cosine signal S2, and the tangent signal, respectively. Specifically, the angle calculation unit 31 transforms, by using an inverse trigonometric function, the sine signal S1 into the first angle signal V51. In addition, the angle calculation unit 31 transforms, by using an inverse trigonometric function, the cosine signal S2 into the second angle signal V52. Furthermore, the angle calculation unit 31 transforms, by using an inverse trigonometric function, the tangent signal into the third angle signal V53.

In this case, in a first period PE1 in which the value of the sine signal S1 is included between the first threshold value th1 and the second threshold value th2 as shown in FIG. 2, the angle calculation unit 31 transforms the sine signal S1 into the first angle signal V51 and transforms the tangent signal into the third angle signal V53. In other words, if the value of the sine signal S1 is included between the first threshold value th1 and the second threshold value th2, the angle calculation unit 31 transforms the sine signal S1 into the first angle signal V51 and transforms the tangent signal into the third angle signal V53 in the angle calculating step.

In the first period PE1, the value of the cosine signal S2 is in the vicinity of a peak value (maximum amplitude A1) as shown in FIG. 2, and therefore, the cosine signal S2 varies less significantly as the angle of rotation θ changes. Thus, in the first period PE1, the angle calculation unit 31 transforms the sine signal S1 into the first angle signal V51 and transforms the tangent signal into the third angle signal V53. In this case, the angle calculation unit 31 may or may not transform the cosine signal S2 into the second angle signal V52.

In this case, in a second period PE2 in which the value of the cosine signal S2 is included between the first threshold value th1 and the second threshold value th2 as shown in FIG. 2, the angle calculation unit 31 transforms the cosine signal S2 into the second angle signal V52 and transforms the tangent signal into the third angle signal V53. In other words, if the value of the cosine signal S2 is included between the first threshold value th1 and the second threshold value th2, the angle calculation unit 31 transforms the cosine signal S2 into the second angle signal V52 and transforms the tangent signal into the third angle signal V53 in the angle calculating step.

In the second period PE2, the value of the sine signal S1 is in the vicinity of a peak value as shown in FIG. 2, and therefore, the sine signal S1 varies less significantly as the angle of rotation θ changes. Thus, in the second period PE2, the angle calculation unit 31 transforms the cosine signal S2 into the second angle signal V52 and transforms the tangent signal into the third angle signal V53. In this case, the angle calculation unit 31 may or may not transform the sine signal S1 into the first angle signal V51.

In this case, the angle of rotation θ may be calculated based on the sine signal S1 by the following Equation (3):

$$\theta = \sin^{-1}(\sin \theta) \quad (3)$$

Also, the angle of rotation θ may be calculated based on the cosine signal S2 by the following Equation (4):

$$\theta = \cos^{-1}(\cos \theta) \quad (4)$$

Furthermore, the angle of rotation θ may be calculated based on tangent signal, which has been obtained based on the sine signal S1 and the cosine signal S2, by the following Equation (5):

$$\theta = \tan^{-1}\left(\frac{\sin \theta}{\cos \theta}\right) \quad (5)$$

Thus, in the first period PE1, the angle calculation unit 31 performs arcsin processing on the sine signal S1 and arctan processing on the tangent signal, thereby calculating the first angle information and the third angle information. Also, in the second period PE2, the angle calculation unit 31 performs arccos processing on the cosine signal S2 and arctan processing on the tangent signal, thereby calculating the second angle information and the third angle information. Then, the angle calculation unit 31 outputs an angle signal V5 including the angle information thus calculated to an external circuit (such as an ECU).

The failure diagnosis unit 32 makes a failure diagnosis of the first magnetic detection unit 1 and the second magnetic detection unit 2 by comparing with each other two or more pieces of angle information selected from the first angle information, the second angle information, and the third angle information. The first angle information is angle information obtained based on the sine signal S1 supplied from the first magnetic detection unit 1. The second angle information is angle information obtained based on the cosine signal S2 supplied from the second magnetic detection unit 2. The third angle information is angle information obtained based on the tangent signal that has been obtained based on the sine signal S1 and the cosine signal S2.

In the first period PE1, the failure diagnosis unit 32 makes a failure diagnosis of the first magnetic detection unit 1 by comparing the first angle information and the third angle information with each other. In the second period PE2, the failure diagnosis unit 32 makes a failure diagnosis of the second magnetic detection unit 2 by comparing the second angle information and the third angle information with each other. Then, the failure diagnosis unit 32 outputs a failure signal V6 including the result of the failure diagnosis to an external circuit (such as an ECU). That is to say, the failure diagnosis unit 32 makes a failure diagnosis of the first magnetic detection unit 1 or the second magnetic detection unit 2 by comparing either the first angle information or the second angle information with the third angle information in the failure diagnosis step.

If the value a2 of the cosine signal S2 is equal to zero, then value of the tangent signal diverges. Thus, in that case, the failure diagnosis unit 32 preferably makes a failure diagnosis of either the first magnetic detection unit 1 or the second magnetic detection unit 2 by comparing the first angle information and the second angle information with each other. Nevertheless, in that case, it just turns out that a failure has been caused in at least one of the first magnetic detection unit 1 or the second magnetic detection unit 2 and it cannot be determined which of the two detection units has caused the failure.

The processing unit 3 may be implemented as, for example, a microcomputer including a processor and a memory. That is to say, the processing unit 3 is implemented as a computer system including a processor and a memory. The computer system performs the functions of the processing unit 3 (including the angle calculation unit 31 and the failure diagnosis unit 32) by making the processor execute an appropriate program. The program may be stored in advance in the memory. Alternatively, the program may also be downloaded via a telecommunications line such as the Internet or distributed after having been stored in a non-transitory storage medium such as a memory card.

(3) Operation

Figure 3:
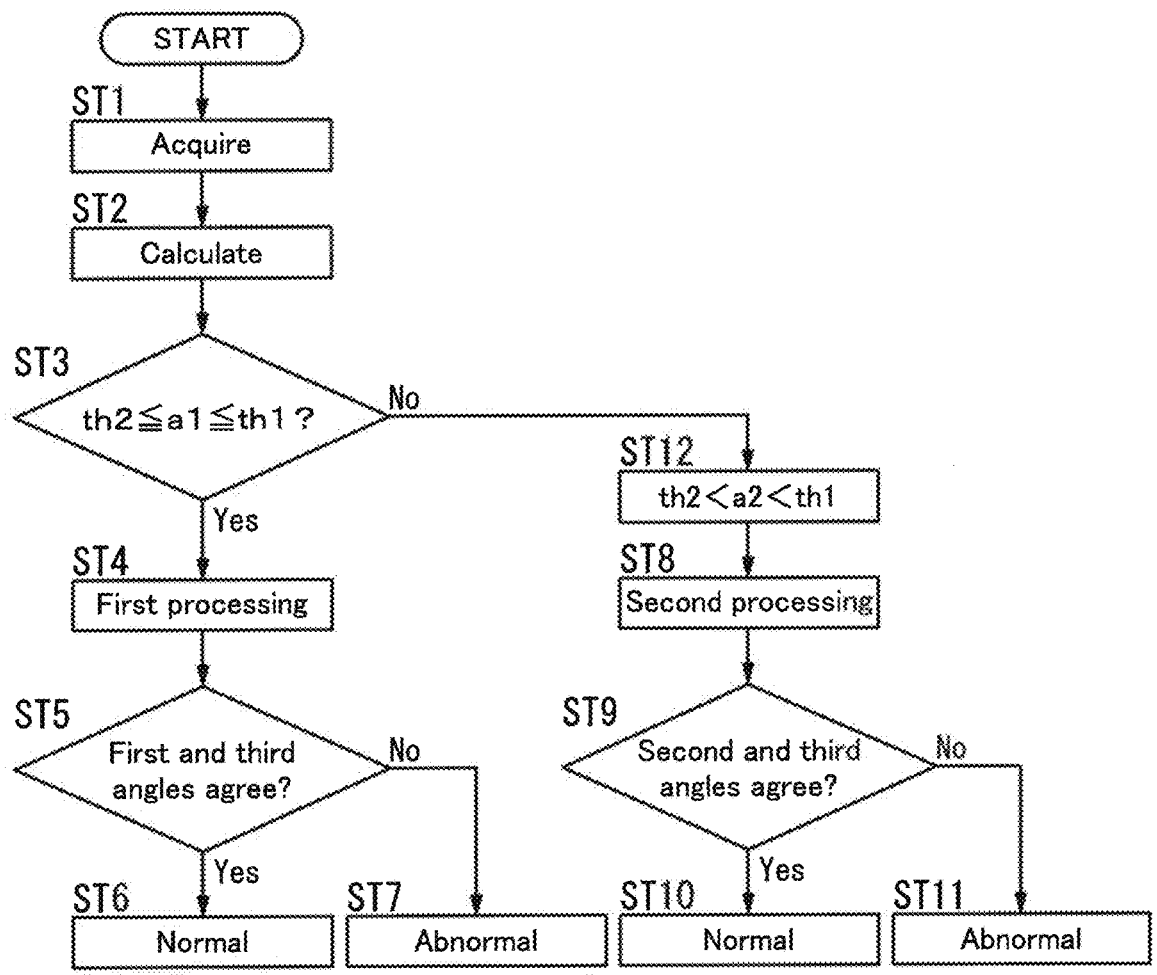
FIG. 3 is a flowchart showing how the signal processing system may operate.

Next, it will be described with reference to FIGS. 2 and 3 how the signal processing system 100 according to this embodiment operates. In FIG. 2, the abscissa indicates the angle of detection (mechanical angle) of a rotator (i.e., a magnetic field from a magnet) and the ordinate indicates the output values (output voltage values) of the first magnetic detection unit 1 and the second magnetic detection unit 2. Also, in FIG. 2, the first period PE1 is a period when the angle of detection is in the range from 0 degrees to 22.5 degrees, in the range from 67.5 degrees to 112.5 degrees, in the range from 157.5 degrees to 202.5 degrees, in the range from 247.5 degrees to 292.5 degrees, and in the range from 337.5 degrees to 360 degrees. Also, in FIG. 2, the second period PE2 is a period when the angle of detection is in the range from 22.5 degrees to 67.5 degrees, in the range from 112.5 degrees to 157.5 degrees, in the range from 202.5 degrees to 247.5 degrees, and in the range from 292.5 degrees to 337.5 degrees. In this embodiment, the first period PE1 and the second period PE2 alternate with each other as shown in FIG. 2.

In the signal processing system 100 according to this embodiment, the first magnetoresistance element 11 and the second magnetoresistance element 21 are each implemented as an AMR element. Thus, as the sine signal S1 and the cosine signal S2 change by $2\pi$, the angle of rotation $\theta$ changes by 180 degrees.

The angle calculation unit 31 of the processing unit 3 acquires the sine signal S1 from the first magnetic detection unit 1 and also acquires the cosine signal S2 from the second magnetic detection unit 2 (in Step ST1). Next, the angle calculation unit 31 calculates a tangent signal based on the sine signal S1 and the cosine signal S2 (in Step ST2). The angle calculation unit 31 determines whether or not the value a1 of the sine signal S1 is included between the first threshold value th1 and the second threshold value th2 (in Step ST3). Since the value a1 of the sine signal S1 is included between the first threshold value th1 and the second threshold value th2 in the first period PE1 (i.e., the answer is YES in Step ST3), the angle calculation unit 31 performs arcsin processing on the sine signal S1 and performs arctan processing on the tangent signal (in Step ST4). In this manner, the angle calculation unit 31 calculates the first angle information corresponding to the sine signal S1 and the third angle information corresponding to the tangent signal.

The failure diagnosis unit 32 compares the first angle information and third angle information that have been calculated in Step ST4 by the angle calculation unit 31 (in Step ST5). When finding that the first angle information and the third angle information agree with each other (if the answer is YES in Step ST5), the failure diagnosis unit 32 decides (i.e., diagnoses) that the first magnetic detection unit 1 should be operating properly (normal) (in Step ST6). On the other hand, when finding that the first angle information and the third angle information disagree with each other (if the answer is NO in Step ST5), the failure diagnosis unit 32 decides (i.e., diagnoses) that the first magnetic detection unit 1 should have caused a failure (in Step ST7).

Since the value a1 of the sine signal S1 is not included between the first threshold value th1 and the second threshold value th2 in the second period PE2 (i.e., the answer is NO in Step ST3) and thus the value a2 of the cosine signal S2 is included between the first threshold value th1 and the second threshold value th2 (in Step ST12) in the second period PE2, the angle calculation unit 31 performs arccos processing on the cosine signal S2 and performs arctan processing on the tangent signal (in Step ST8). In this manner, the angle calculation unit 31 calculates the second angle information corresponding to the cosine signal S2 and also calculates the third angle information corresponding to the tangent signal.

The failure diagnosis unit 32 compares the second angle information and third angle information that have been calculated in Step ST8 by the angle calculation unit 31 (in Step ST9). When finding that the second angle information and the third angle information agree with each other (if the answer is YES in Step ST9), the failure diagnosis unit 32 decides (i.e., diagnoses) that the second magnetic detection unit 2 should be operating properly (normal) (in Step ST10). On the other hand, when finding that the second angle information and the third angle information disagree with each other (if the answer is NO in Step ST9), the failure diagnosis unit 32 decides (i.e., diagnoses) that the second magnetic detection unit 2 should have caused a failure (in Step ST11).

That is to say, the failure diagnosis unit 32 determines as described above in the failure diagnosis step which of the first magnetic detection unit 1 or the second magnetic detection unit 2 has caused a failure.

In this embodiment, in the first period PE1, the failure diagnosis unit 32 makes a failure diagnosis of the first magnetic detection unit 1 by comparing the first angle information and the third angle information with each other as described above. In this case, the first magnetic detection unit 1 may be operating properly but the second magnetic detection unit 2 may have caused a failure. Thus, in the first period PE1, the failure diagnosis unit 32 preferably makes a failure diagnosis of both the first magnetic detection unit 1 and the second magnetic detection unit 2 by comparing the first angle information, the second angle information, and the third angle information with each other so as to make a diagnosis on the failure of the second magnetic detection unit 2 as well. Suppose, for example, a situation where the first magnetic detection unit 1 is operating properly and the second magnetic detection unit 2 has caused a failure. In that case, the first angle information and the third angle information agree with each other, but the second angle information and the third angle information disagree with each other. This allows the failure diagnosis unit 32 to decide (diagnose) that the second magnetic detection unit 2 should have caused a failure.

In this case, if the failure diagnosis unit 32 has diagnosed that the first magnetic detection unit 1 should be operating properly and the second magnetic detection unit 2 should have caused a failure, then the angle of rotation $\theta$ described above is preferably detected with only the first magnetic detection unit 1 activated and the second magnetic detection unit 2 deactivated. This may ensure redundancy compared to a situation where the first magnetic detection unit 1 and the second magnetic detection unit 2 are both deactivated.

In the second period PE2, the failure diagnosis unit 32 makes a failure diagnosis of the second magnetic detection unit 2 by comparing the second angle information and the third angle information with each other. In this case, the second magnetic detection unit 2 may be operating properly but the first magnetic detection unit 1 may have caused a failure. Thus, in the second period PE2, the failure diagnosis unit 32 preferably makes a failure diagnosis of both the first magnetic detection unit 1 and the second magnetic detection unit 2 by comparing the first angle information, the second angle information, and the third angle information with each other so as to make a diagnosis on the failure of the first magnetic detection unit 1 as well. Suppose, for example, a situation where the second magnetic detection unit 2 is operating properly and the first magnetic detection unit 1 has caused a failure. In that case, the second angle information and the third angle information agree with each other, but the first angle information and the third angle information disagree with each other. This allows the failure diagnosis unit 32 to decide (diagnose) that the first magnetic detection unit 1 should have caused a failure.

In this case, if the failure diagnosis unit 32 has diagnosed that the second magnetic detection unit 2 should be operating properly and the first magnetic detection unit 1 should have caused a failure, then the angle of rotation θ described above is preferably detected with only the second magnetic detection unit 2 activated and the first magnetic detection unit 1 deactivated. This may ensure redundancy compared to a situation where the first magnetic detection unit 1 and the second magnetic detection unit 2 are both deactivated.

(4) Advantages

In the signal processing system 100 according to this embodiment, the number of the first magnetic detection unit 1 provided is one and the number of the second magnetic detection unit 2 provided is also one. Thus, only one first amplifier 12 and only one first A/D converter 13 are provided to process the signal supplied from the first magnetoresistance element 11. Likewise, only one second amplifier 22 and only one second A/D converter 23 are provided to process the signal supplied from the second magnetoresistance element 21. This enables making a failure diagnosis of the first magnetic detection unit 1 and the second magnetic detection unit 2 while reducing an increase in the overall size of the signal processing system 100 compared to a situation where two detection circuits (namely, a first detection circuit and a second detection circuit) are provided as in the magnetic sensor of Patent Literature 1 mentioned above.

In addition, the signal processing system 100 according to this embodiment may also determine which of the first magnetic detection unit 1 or the second magnetic detection unit 2 has caused a failure. This may ensure redundancy for the signal processing system 100 by making a properly operating one of the first magnetic detection unit 1 or the second magnetic detection unit 2 detect the angle of rotation θ.

Furthermore, the signal processing system 100 according to this embodiment may determine with more reliability, by comparing the first angle information, the second angle information, and the third angle information with each other, which of the first magnetic detection unit 1 or the second magnetic detection unit 2 has caused a failure.

(5) Variations

Note that the embodiment described above is only an exemplary one of various embodiments of the present disclosure and should not be construed as limiting. Rather, the exemplary embodiment may be readily modified in various manners depending on a design choice or any other factor without departing from the scope of the present disclosure. Optionally, the functions of the signal processing system 100 according to the exemplary embodiment described above may also be implemented as a signal processing method, a computer program, or a non-transitory storage medium that stores the computer program thereon. A program according to an aspect is designed to cause one or more processors to perform the signal processing method described above.

Next, variations of the exemplary embodiment will be enumerated one after another. Note that the variations to be described below may be adopted as appropriate in combination.

The signal processing system 100 according to the present disclosure includes a computer system. The computer system may include, as principal hardware components, a processor and a memory. The functions of the signal processing system 100 according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive, any of which is readable for the computer system. The processor of the computer system may be made up of a single or a plurality of electronic circuits including a semiconductor integrated circuit (IC) or a large-scale integrated circuit (LSI). As used herein, the "integrated circuit" such as an IC or an LSI is called by a different name depending on the degree of integration thereof. Examples of the integrated circuits include a system LSI, a very-large-scale integrated circuit (VLSI), and an ultra-large-scale integrated circuit (VLSI). Optionally, a field-programmable gate array (FPGA) to be programmed after an LSI has been fabricated or a reconfigurable logic device allowing the connections or circuit sections inside of an LSI to be reconfigured may also be adopted as the processor. Those electronic circuits may be either integrated together on a single chip or distributed on multiple chips, whichever is appropriate. Those multiple chips may be aggregated together in a single device or distributed in multiple devices without limitation. As used herein, the "computer system" includes a microcontroller including one or more processors and one or more memories. Thus, the microcontroller may also be implemented as a single or a plurality of electronic circuits including a semiconductor integrated circuit or a large-scale integrated circuit.

Also, in the embodiment described above, the plurality of functions of the signal processing system 100 are integrated together in a single housing. However, this is not an essential configuration for the signal processing system 100. Alternatively, those constituent elements of the signal processing system 100 may be distributed in multiple different housings. Still alternatively, at least some functions of the signal processing system 100 (e.g., some functions of the processing unit 3) may be implemented as, for example, a cloud computing system as well.

In the embodiment described above, the first magnetoresistance element 11 and the second magnetoresistance element 21 are each implemented as an anisotropic magnetoresistance (AMR) element. However, this is only an example and should not be construed as limiting. Alternatively, each of the first magnetoresistance element 11 and the second magnetoresistance element 21 may be implemented as, for example, a tunnel magnetoresistance (TMR) element or a giant magnetoresistance (GMR) element. Furthermore, the first magnetoresistance element 11 and the second magnetoresistance element 21 may be the same type of elements or two different types of elements, whichever is appropriate. For example, the first magnetoresistance element 11 may be an AMR element and the second magnetoresistance element 21 may be a TMR element. In this case, if the first magnetoresistance element 11 and the second magnetoresistance element 21 are both TMR elements or GMR elements, the sine signal S1 and the cosine signal S2 change by $2\pi$ while the angle of rotation θ changes by 360 degrees.

Figure 4:
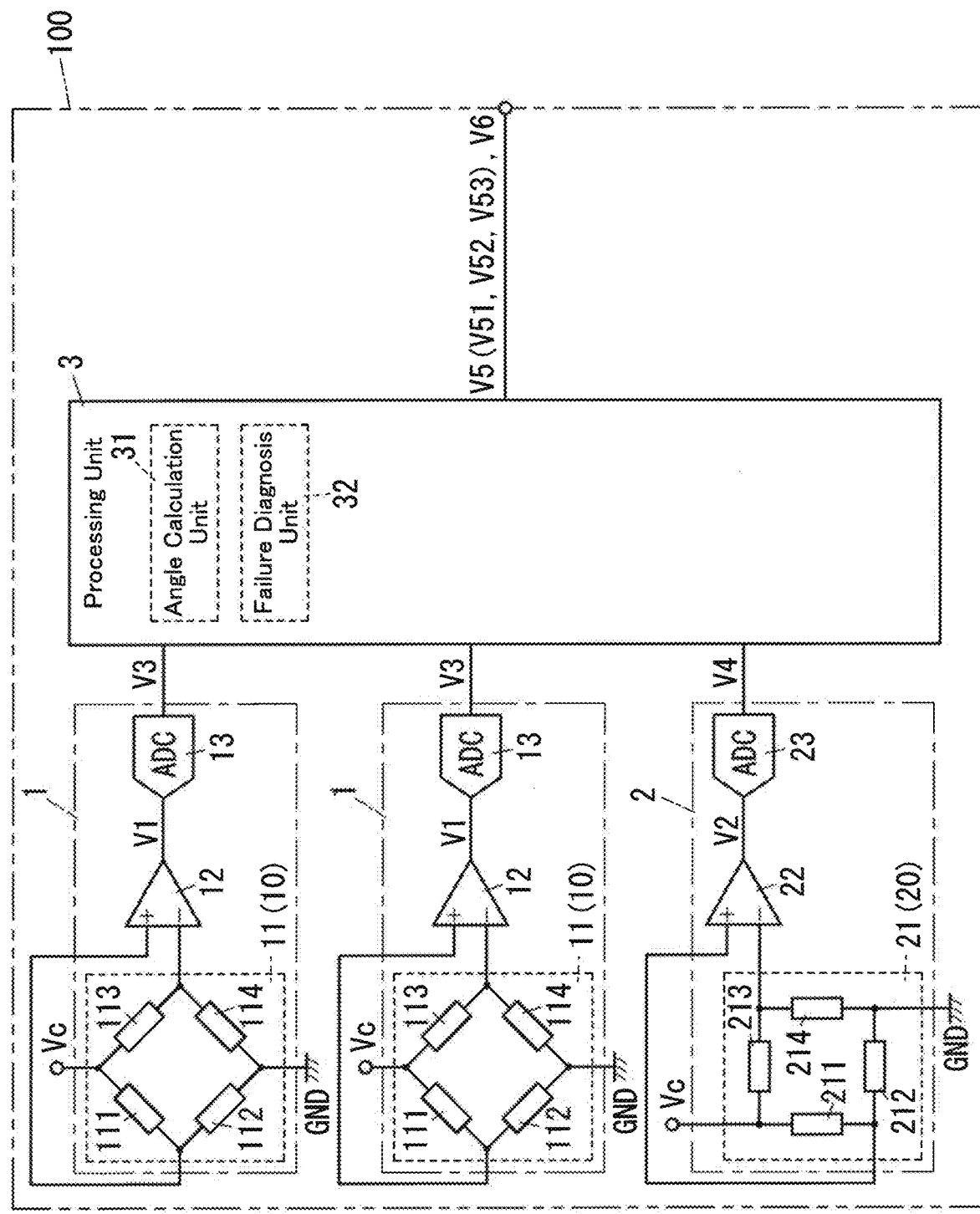
FIG. 4 is a block diagram illustrating a configuration for a signal processing system according to an exemplary embodiment.
Figure 5:
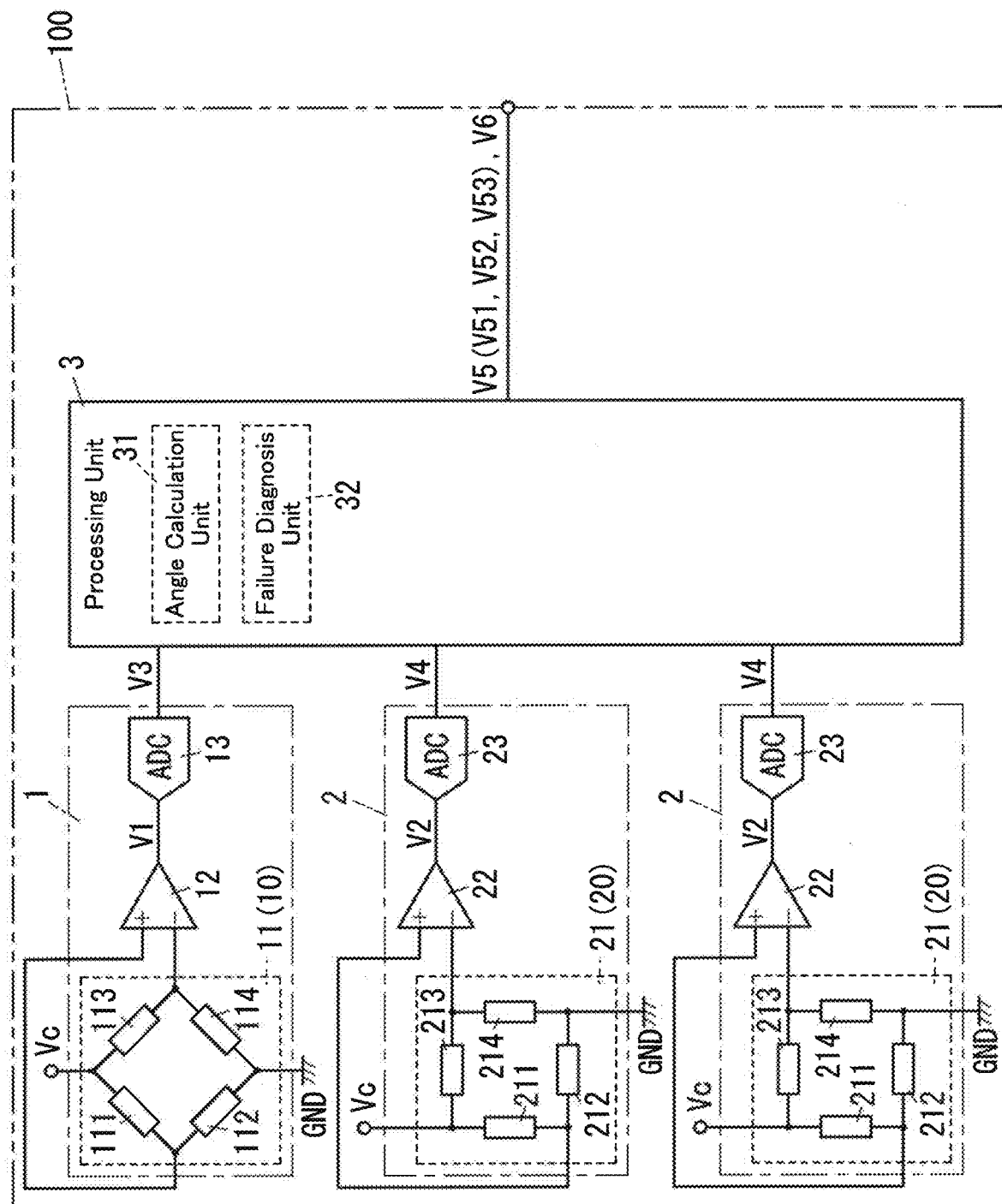
FIG. 5 is a block diagram illustrating a configuration for a signal processing system according to an exemplary embodiment.

In the embodiment described above, only one first magnetic detection unit 1 is provided to output the sine signal S1 and only one second magnetic detection unit 2 is provided to output the cosine signal S2. However, this is only an example and should not be construed as limiting. Alternatively, for example, one first magnetic detection unit 1 may be provided and two second magnetic detection units 2 may be provided, or vice versa, as shown in FIGS. 4 and 5. In other words, in the signal processing method according to the exemplary embodiment, the numerical number of one type of magnetic detection unit provided, selected from the first magnetic detection unit 1 and the second magnetic detection unit 2, may be one, and the numerical number of the other type of magnetic detection units provided may be two. This enables making a failure diagnosis of the first magnetic detection unit 1 and the second magnetic detection unit 2 while reducing an increase in the overall size of the signal processing system 100, compared to a situation where the number of the first magnetic detection units 1 provided and the number of the second magnetic detection units 2 provided are both two.

Furthermore, in the exemplary embodiment described above, the failure diagnosis unit 32 makes a failure diagnosis of the first magnetic detection unit 1 and the second magnetic detection unit 2 by comparing with each other two or more pieces of angle information selected from the group consisting of the first angle information, the second angle information, and the third angle information. On the other hand, when finding the value a1 of the sine signal S1 varying discontinuously, the failure diagnosis unit 32 may diagnose, in the failure diagnosis step, that the first magnetic detection unit 1 should have caused a failure. Also, when finding the value a2 of the cosine signal S2 varying discontinuously, the failure diagnosis unit 32 may diagnose, in the failure diagnosis step, that the second magnetic detection unit 2 should have caused a failure. For example, if the first magnetic detection unit 1 is operating properly, the value a1 of the sine signal S1 varies continuously as shown in FIG. 2. However, if the first magnetic detection unit 1 has caused a failure, then the value a1 of the sine signal S1 is discontinuous in some periods. This allows the failure diagnosis unit 32 to make a failure diagnosis of the first magnetic detection unit 1 and the second magnetic detection unit 2 based on variations in the value a1 of the sine signal S1 and the value a2 of the cosine signal S2. In that case, the failure diagnosis unit 32 has the results of computations made by the angle calculation unit 31 stored in a memory of the processing unit 3 and determines, by reference to the history of the results of computations stored in the memory, the degrees of continuity of the sine signal S1 and the cosine signal S2.

Alternatively, the failure diagnosis unit 32 may also make a failure diagnosis of the first magnetic detection unit 1 based on the entire waveform of the sine signal S1 and make a failure diagnosis of the second magnetic detection unit 2 based on the entire waveform of the cosine signal S2.

In the exemplary embodiment described above, the first magnetic detection unit 1 includes the first A/D converter 13 and the second magnetic detection unit 2 includes the second A/D converter 23. Optionally, at least one of the first A/D converter 13 or the second A/D converter 23 may be omitted.

(Recapitulation)

As can be seen from the foregoing description, a signal processing method according to a first aspect is designed for use in a signal processing system (100). The signal processing system (100) includes a first magnetic detection unit (1), a second magnetic detection unit (2), and a processing unit (3). The first magnetic detection unit (1) outputs a sine signal (S1) corresponding to an angle of rotation of a detected magnetic field. The second magnetic detection unit (2) outputs a cosine signal (S2) corresponding to the angle of rotation of the detected magnetic field and having a phase difference of $\pi/2$ from the sine signal (S1). The processing unit (3) outputs, based on at least one of the sine signal (S1) or the cosine signal (S2), an angle signal (V5) and a failure signal (V6). The angle signal (V5) includes angle information about the angle of rotation of the detected magnetic field. The failure signal (V6) includes failure information about a failure of at least one of the first magnetic detection unit (1) or the second magnetic detection unit (2). The signal processing method includes an angle calculating step and a failure diagnosis step. The angle calculating step includes transforming, by using an inverse trigonometric function, the sine signal (S1), the cosine signal (S2), and a tangent signal into a first angle signal (V51) serving as the angle signal (V5), a second angle signal (V52), and a third angle signal (V53), respectively. The tangent signal is a signal based on the sine signal (S1) and the cosine signal (S2). The failure diagnosis step includes making a failure diagnosis of the first magnetic detection unit (1) and the second magnetic detection unit (2) by comparing with each other two or more pieces of angle information selected from the group consisting of first angle information, second angle information, and third angle information. The first angle information is angle information included in the first angle signal (V51). The second angle information is angle information included in the second angle signal (V52). The third angle information is angle information included in the third angle signal (V53).

This aspect enables making a failure diagnosis of the first magnetic detection unit (1) and the second magnetic detection unit (2) while reducing an increase in the overall size of the signal processing system (100).

In a signal processing method according to a second aspect, which may be implemented in conjunction with the first aspect, a first threshold value (th1) and a second threshold value (th2), which are values at respective intersections (PO1, PO2) between the sine signal (S1) and the cosine signal (S2), are set. The second threshold value (th2) is smaller than the first threshold value (th1). The angle calculating step includes transforming the sine signal (S1) into the first angle signal (V51) and the tangent signal into the third angle signal (V53) when a value of the sine signal (S1) is included between the first threshold value (th1) and the second threshold value (th2). The angle calculating step includes transforming the cosine signal (S2) into the second angle signal (V52) and the tangent signal into the third angle signal (V53) when a value of the cosine signal (S2) is included between the first threshold value (th1) and the second threshold value (th2).

This aspect enables determining which of the first magnetic detection unit (1) or the second magnetic detection unit (2) has caused a failure.

In a signal processing method according to a third aspect, which may be implemented in conjunction with the first or second aspect, the first magnetic detection unit (1) includes a first A/D converter (13) to convert an analog signal into a digital signal. The second magnetic detection unit (2) includes a second A/D converter (23) to convert an analog signal into a digital signal.

This aspect enables accurately detecting the sine signal (S1) and the cosine signal (S2) by converting an analog signal into a digital signal.

In a signal processing method according to a fourth aspect, which may be implemented in conjunction with any one of the first to third aspects, the failure diagnosis step includes making the failure diagnosis by comparing either the first angle information or the second angle information with the third angle information.

This aspect enables making a failure diagnosis of the first magnetic detection unit (1) by comparing the first angle information with the third angle information and making a failure diagnosis of the second magnetic detection unit (2) by comparing the second angle information with the third angle information.

In a signal processing method according to a fifth aspect, which may be implemented in conjunction with any one of the first to third aspects, the failure diagnosis step includes making, when the cosine signal (S2) has a value of zero, the failure diagnosis by comparing the first angle information with the second angle information.

This aspect enables determining, by comparing the first angle information with the second angle information, which of the first magnetic detection unit (1) or the second magnetic detection unit (2) has caused a failure.

In a signal processing method according to a sixth aspect, which may be implemented in conjunction with any one of the first to fifth aspects, the failure diagnosis step includes making the failure diagnosis by comparing the first angle information, the second angle information, and the third angle information with each other.

This aspect enables determining which of the first magnetic detection unit (1) or the second magnetic detection unit (2) has caused a failure.

In a signal processing method according to a seventh aspect, which may be implemented in conjunction with any one of the first to sixth aspects, the failure diagnosis step includes determining which of the first magnetic detection unit (1) or the second magnetic detection unit (2) has caused a failure.

This aspect enables determining which of the first magnetic detection unit (1) or the second magnetic detection unit (2) has caused a failure.

A signal processing method according to an eighth aspect, which may be implemented in conjunction with any one of the first to seventh aspects, includes making the second magnetic detection unit (2) detect the angle of rotation of the detected magnetic field when a diagnosis is made in the failure diagnosis step that the first magnetic detection unit (1) have caused a failure. The signal processing method includes making the first magnetic detection unit (1) detect the angle of rotation of the detected magnetic field when a diagnosis is made in the failure diagnosis step that the second magnetic detection unit (2) have caused a failure.

This aspect may ensure redundancy for the signal processing system (100).

In a signal processing method according to a ninth aspect, which may be implemented in conjunction with any one of the first to eighth aspects, the failure diagnosis step includes making a diagnosis that the first magnetic detection unit (1) have caused a failure when finding a value of the sine signal (S1) varying discontinuously. The failure diagnosis step includes making a diagnosis that the second magnetic detection unit (2) have caused a failure when finding a value of the cosine signal (S2) varying discontinuously.

This aspect enables determining which of the first magnetic detection unit (1) or the second magnetic detection unit (2) has caused a failure.

In a signal processing method according to a tenth aspect, which may be implemented in conjunction with any one of the first to ninth aspects, a numerical number of the first magnetic detection unit (1) provided is one, and a numerical number of the second magnetic detection unit (2) provided is one.

This aspect enables reducing the overall size of the signal processing system (100) compared to a situation where the number of the first magnetic detection units (1) provided and the number of the second magnetic detection units (2) provided are both two.

In a signal processing method according to an eleventh aspect, which may be implemented in conjunction with any one of the first to ninth aspects, a numerical number of one type of magnetic detection unit provided, selected from the group consisting of the first magnetic detection unit (1) and the second magnetic detection unit (2) is one, and a numerical number of the other type of magnetic detection unit provided, selected from the group consisting of the first magnetic detection unit (1) and the second magnetic detection unit (2), is two.

This aspect enables reducing the overall size of the signal processing system (100) compared to a situation where the number of the first magnetic detection units (1) provided and the number of the second magnetic detection units (2) provided are both two.

A program according to a twelfth aspect is designed to cause one or more processors to perform the signal processing method according to any one of the first to eleventh aspects.

This aspect enables making a failure diagnosis of the first magnetic detection unit (1) and the second magnetic detection unit (2) while reducing an increase in the overall size of the signal processing system (100).

A signal processing system (100) according to a thirteenth aspect includes a first magnetic detection unit (1), a second magnetic detection unit (2), and a processing unit (3). The first magnetic detection unit (1) outputs a sine signal (S1) corresponding to an angle of rotation of a detected magnetic field. The second magnetic detection unit (2) outputs a cosine signal (S2) corresponding to the angle of rotation of the detected magnetic field and having a phase difference of π/2 from the sine signal (S1). The processing unit (3) outputs, based on at least one of the sine signal (S1) or the cosine signal (S2), an angle signal (V5) and a failure signal (V6). The angle signal (V5) includes angle information about the angle of rotation of the detected magnetic field. The failure signal (V6) includes failure information about a failure of at least one of the first magnetic detection unit (1) or the second magnetic detection unit (2). The processing unit (3) includes an angle calculation unit (31) and a failure diagnosis unit (32). The angle calculation unit (31) transforms, by using an inverse trigonometric function, the sine signal (S1), the cosine signal (S2), and a tangent signal into a first angle signal (V51) serving as the angle signal (V5), a second angle signal (V52), and a third angle signal (V53), respectively. The tangent signal is a signal based on the sine signal (S1) and the cosine signal (S2). The failure diagnosis unit (32) makes a failure diagnosis of the first magnetic detection unit (1) and the second magnetic detection unit (2) by comparing with each other two or more pieces of angle information selected from the group consisting of first angle information, second angle information, and third angle information. The first angle information is angle information included in the first angle signal (V51). The second angle information is angle information included in the second angle signal (V52). The third angle information is angle information included in the third angle signal (V53).

This aspect enables making a failure diagnosis of the first magnetic detection unit (1) and the second magnetic detection unit (2) while reducing an increase in the overall size of the signal processing system (100).

Note that the features according to the second to eleventh aspects are not essential features for the signal processing method but may be omitted as appropriate.

REFERENCE SIGNS LIST

1 First Magnetic Detection Unit
2 Second Magnetic Detection Unit
3 Processing Unit
13 First A/D Converter
21 Second A/D Converter
31 Angle Calculation Unit
32 Failure Diagnosis Unit
100 Signal Processing System
PO1, PO2 Intersection
S1 Sine Signal
S2 Cosine Signal
th1 First Threshold Value
th2 Second Threshold Value
V5 Angle Signal
V51 First Angle Signal
V52 Second Angle Signal
V53 Third Angle Signal
V6 Failure Signal

The invention claimed is:
1. A signal processing method for use in a signal processing system, the signal processing system including:
   a first magnetic detection unit configured to output a sine signal corresponding to an angle of rotation of a detected magnetic field;
   a second magnetic detection unit configured to output a cosine signal corresponding to the angle of rotation of the detected magnetic field and having a phase difference of $\pi/2$ from the sine signal; and
   a processing unit configured to output, based on at least one of the sine signal or the cosine signal, an angle signal including angle information about the angle of rotation of the detected magnetic field and a failure signal including failure information about a failure of at least one of the first magnetic detection unit or the second magnetic detection unit,
   the signal processing method comprising:
      an angle calculating step including transforming, by using an inverse trigonometric function, the sine signal, the cosine signal, and a tangent signal based on the sine signal and the cosine signal into a first angle signal serving as the angle signal, a second angle signal, and a third angle signal, respectively; and
      a failure diagnosis step including making a failure diagnosis of the first magnetic detection unit and the second magnetic detection unit by comparing with each other two or more pieces of angle information selected from the group consisting of first angle information included in the first angle signal, second angle information included in the second angle signal, and third angle information included in the third angle signal,
   wherein the failure diagnosis step includes making the failure diagnosis by comparing either the first angle information or the second angle information with the third angle information.

2. The signal processing method of claim 1, wherein
   a first threshold value and a second threshold value, which are values at respective intersections between the sine signal and the cosine signal, are set, the second threshold value being smaller than the first threshold value, and
   the angle calculating step includes:
   transforming the sine signal into the first angle signal and the tangent signal into the third angle signal when a value of the sine signal is included between the first threshold value and the second threshold value; and
   transforming the cosine signal into the second angle signal and the tangent signal into the third angle signal when a value of the cosine signal is included between the first threshold value and the second threshold value.

3. The signal processing method of claim 1, wherein
   the first magnetic detection unit includes a first A/D converter configured to convert an analog signal into a digital signal, and
   the second magnetic detection unit includes a second A/D converter configured to convert an analog signal into a digital signal.

4. The signal processing method of claim 1, wherein
   the failure diagnosis step includes making, when the cosine signal has a value of zero, the failure diagnosis by comparing the first angle information with the second angle information.

5. The signal processing method of claim 1, wherein
   the failure diagnosis step includes making the failure diagnosis by comparing the first angle information, the second angle information, and the third angle information with each other.

6. The signal processing method of claim 1, wherein
   the failure diagnosis step includes determining which of the first magnetic detection unit or the second magnetic detection unit has caused a failure.

7. The signal processing method of claim 1, comprising
   making the second magnetic detection unit detect the angle of rotation of the detected magnetic field when a diagnosis is made in the failure diagnosis step that the first magnetic detection unit have caused a failure; and
   making the first magnetic detection unit detect the angle of rotation of the detected magnetic field when a diagnosis is made in the failure diagnosis step that the second magnetic detection unit have caused a failure.

8. The signal processing method of claim 1, wherein
   the failure diagnosis step includes
   making a diagnosis that the first magnetic detection unit have caused a failure when finding a value of the sine signal varying discontinuously; and
   making a diagnosis that the second magnetic detection unit have caused a failure when finding a value of the cosine signal varying discontinuously.

9. The signal processing method of claim 1, wherein
a numerical number of the first magnetic detection unit provided is one, and
a numerical number of the second magnetic detection unit provided is one.

10. The signal processing method of claim 1, wherein
a numerical number of one type of magnetic detection unit provided, selected from the group consisting of the first magnetic detection unit and the second magnetic detection unit, is one, and
a numerical number of the other type of magnetic detection units provided, selected from the group consisting of the first magnetic detection unit and the second magnetic detection unit, is two.

11. A non-transitory computer-readable tangible recording medium storing a program designed to cause one or more processors to perform the signal processing method of claim 1.

12. A signal processing system comprising:
a first magnetic detection unit configured to output a sine signal corresponding to an angle of rotation of a detected magnetic field;
a second magnetic detection unit configured to output a cosine signal corresponding to the angle of rotation of the detected magnetic field and having a phase difference of $\pi/2$ from the sine signal; and
a processing unit configured to output, based on at least one of the sine signal or the cosine signal, an angle signal including angle information about the angle of rotation of the detected magnetic field and a failure signal including failure information about a failure of at least one of the first magnetic detection unit or the second magnetic detection unit,
the processing unit including:
an angle calculation unit configured to transform, by using an inverse trigonometric function, the sine signal, the cosine signal, and a tangent signal based on the sine signal and the cosine signal into a first angle signal serving as the angle signal, a second angle signal, and a third angle signal, respectively; and
a failure diagnosis unit configured to make a failure diagnosis of the first magnetic detection unit and the second magnetic detection unit by comparing with each other two or more pieces of angle information selected from the group consisting of first angle information included in the first angle signal, second angle information included in the second angle signal, and third angle information included in the third angle signal, the failure diagnosis unit being configured to make the failure diagnosis by comparing either the first angle information or the second angle information with the third angle information.

13. A signal processing method for use in a signal processing system, the signal processing system including:
a first magnetic detection unit configured to output a sine signal corresponding to an angle of rotation of a detected magnetic field;
a second magnetic detection unit configured to output a cosine signal corresponding to the angle of rotation of the detected magnetic field and having a phase difference of x/2 from the sine signal; and
a processing unit configured to output, based on at least one of the sine signal or the cosine signal, an angle signal including angle information about the angle of rotation of the detected magnetic field and a failure signal including failure information about a failure of at least one of the first magnetic detection unit or the second magnetic detection unit,
the signal processing method comprising:
an angle calculating step including transforming, by using an inverse trigonometric function, the sine signal, the cosine signal, and a tangent signal based on the sine signal and the cosine signal into a first angle signal serving as the angle signal, a second angle signal, and a third angle signal, respectively; and
a failure diagnosis step including making a failure diagnosis of the first magnetic detection unit and the second magnetic detection unit by comparing with each other two or more pieces of angle information selected from the group consisting of first angle information included in the first angle signal, second angle information included in the second angle signal, and third angle information included in the third angle signal,
wherein the failure diagnosis step includes making the failure diagnosis by comparing the first angle information, the second angle information, and the third angle information with each other.

14. A signal processing system comprising:
a first magnetic detection unit configured to output a sine signal corresponding to an angle of rotation of a detected magnetic field;
a second magnetic detection unit configured to output a cosine signal corresponding to the angle of rotation of the detected magnetic field and having a phase difference of $\pi/2$ from the sine signal; and
a processing unit configured to output, based on at least one of the sine signal or the cosine signal, an angle signal including angle information about the angle of rotation of the detected magnetic field and a failure signal including failure information about a failure of at least one of the first magnetic detection unit or the second magnetic detection unit,
the processing unit including:
an angle calculation unit configured to transform, by using an inverse trigonometric function, the sine signal, the cosine signal, and a tangent signal based on the sine signal and the cosine signal into a first angle signal serving as the angle signal, a second angle signal, and a third angle signal, respectively; and
a failure diagnosis unit configured to make a failure diagnosis of the first magnetic detection unit and the second magnetic detection unit by comparing with each other two or more pieces of angle information selected from the group consisting of first angle information included in the first angle signal, second angle information included in the second angle signal, and third angle information included in the third angle signal, the failure diagnosis unit being configured to make the failure diagnosis by comparing the first angle information, the second angle information, and the third angle information with each other.

\* \* \* \* \*